United States Patent [19]

Sawaya

[11] Patent Number: 5,200,806
[45] Date of Patent: Apr. 6, 1993

[54] LEAD FRAME HAVING A PLURALITY OF ISLAND REGIONS AND A SUSPENSION PIN

[75] Inventor: Hiromiti Sawaya, Kawasaki, Japan

[73] Assignee: Kabushiki Kaisha Toshiba, Kawasaki, Japan

[21] Appl. No.: 678,336

[22] PCT Filed: Sep. 12, 1990

[86] PCT No.: PCT/JP90/01167
§ 371 Date: May 10, 1991
§ 102(e) Date: May 10, 1991

[30] Foreign Application Priority Data

Sep. 12, 1989 [JP] Japan .................................. 1-236406

[51] Int. Cl.⁵ ...................... H01L 23/12; H01L 23/48
[52] U.S. Cl. ...................................... 257/676; 257/675
[58] Field of Search ...................... 357/70, 68; 437/217, 437/220

[56] References Cited

U.S. PATENT DOCUMENTS 4,794,431 12/1988 Park ...................................... 357/70

FOREIGN PATENT DOCUMENTS

| 9104575 | 4/1991 | European Pat. Off. ............... 357/70 |
| 51-00868 | 1/1976 | Japan . |
| 51-67065 | 6/1976 | Japan . |
| 53-108368 | 9/1978 | Japan . |
| 58-27332 | 2/1983 | Japan . |
| 58-220479 | 12/1983 | Japan .................................. 357/70 |
| 61-150356 | 7/1986 | Japan .................................. 357/72 |
| 63-265455 | 11/1988 | Japan .................................. 357/70 |
| 2-284456 | 11/1990 | Japan .................................. 357/70 |
| 3-152965 | 6/1991 | Japan .................................. 437/220 |

Primary Examiner—Rolf Hille
Assistant Examiner—S. V. Clark
Attorney, Agent, or Firm—Foley & Lardner

[57] ABSTRACT

A lead frame of this invention, which is made of a die-cut conductive plate and used for manufacturing a semiconductor device, comprises a frame portion at the peripheral area of the lead frame, a main bed portion supported by support members extending from the frame portion for mounting a semiconductor main chip, a plurality of leads extending from opposite sides of the frame portion toward the inner area of the lead frame, with the tip portion thereof being positioned near at the main bed portion, some of the plurality of leads having a sub-bed portion formed at a predetermined area for mounting a semiconductor sub-chip, and a suspension pin formed outside of a predetermined lead which is positioned at the outmost position of the plurality of leads, the suspension pin extending along the predetermined lead and being resin sealed with the plurality of leads at a resin molding process of semiconductor device manufacturing processes.

10 Claims, 2 Drawing Sheets

5,200,806

LEAD FRAME HAVING A PLURALITY OF ISLAND REGIONS AND A SUSPENSION PIN

FIELD OF THE INVENTION

The present invention relates to a lead frame for use in manufacturing a semiconductor device and a semiconductor device with such a lead frame. More particularly, the present invention relates to a lead frame and a semiconductor device using such a lead frame, suitable for use as a lead frame having a high density of leads, such as a lead frame used for mounting thereon a plurality of semiconductor chips (pellets).

BACKGROUND OF THE INVENTION

With recent extended application fields of semiconductor devices, a surface mount scheme has been widely used for mounting semiconductor devices on a printed circuit board. A lead frame is mainly used for assembling a semiconductor device. A chip is mounted on the bed of a lead frame, with the chip being electrically connected to the lead frame by means of wire bonding.

There are known lead frames capable of mounting a plurality of semiconductor chips. The structure of such lead frames is shown in FIGS. 1A, 1B, 2A, and 2B by way of example. FIGS. 1B and 2B are top views showing such lead frames LF mounting a semiconductor chip, and FIGS. 1A and 2A are perspective views showing the semiconductor chips after resin molding.

Although the details of the structure of lead frames LF differs depending upon their types, all lead frames have a number of leads extending from the periphery of a lead frame toward the center thereof. A lead frame of a dual-in-line package DIP type has leads 1, 1, . . . extending from a frame portion 2. Each unit lead frame LF is partitioned by slits 3. An island (bed portion) 5 is supported near at the tip portion of leads 1 by support members (metal connectors) 6, 6 extending opposite to the island. A semiconductor pellet 4 is mounted on the bed portion 5. The bed portion 5 is integrally formed with the frame portion 2 via the support members 6, 6. The bed portion is formed wider than the lead 1. The semiconductor pellet 4 mounted on the lead frame LF is sealed with a package (enclosure) 7 made of resin by a predetermined process. The perspective views of FIGS. 1A and 2A show the final shape of the finished semiconductor devices. The portion of a lead 1 projecting out of the package 7 is bent by a predetermined angle. The bent portion may take a shape different from those shown in FIGS. 1A and 2A depending upon the type of each surface mount device. A semicircular notch 8a shown in FIG. 1A and a circular recess 8b in the package 7 shown in FIG. 2A are used for indicating the direction of a package and the numbers of lead pins.

It is also known that a plurality of semiconductor chips are mounted on islands of a lead frame of a resin sealed semiconductor package. The size of a chip is generally wider than the width of a lead. It is therefore necessary to make the island formed on a lead wider than the width of a lead. In this case, the ratio of the lead frame metal area to the whole area of a resin sealed package becomes considerably large, lowering the packaging density.

The wiring pattern of leads within the package has less space at the inner end portions of leads near the chip. Therefore, in many cases it is impossible to form another island near the inner end portion of a lead. However, there is often a space for forming an island at the intermediate portion between the inner end portion and the outer end portion. It is also known that an island is formed at such an intermediate portion in order to mount a plurality of chips.

Conventionally, it has been necessary in general to prepare commonly-called suspension pins which prevent a semiconductor device from being dismounted from the lead frame while performing lead forming after resin molding and electrode lead cutting. Therefore, in many cases there is no space for forming suspension pins if a plurality of chips are to be mounted, so that it is impossible to manufacture a resin sealed semiconductor device having a plurality of chips mounted thereon, i.e., to manufacture a highly value-added semiconductor device.

SUMMARY OF THE INVENTION

It is an object of the present invention to provide a lead frame capable of mounting a plurality of semiconductor chips and forming suspension pins without any restriction by leads and bed portions, and to provide a semiconductor device having such a lead frame.

A lead frame of this invention, which is made of a die-cut conductive plate and used for manufacturing a semiconductor device, comprises a frame portion at the peripheral area of the lead frame, a main bed portion supported by support members extending from the frame portion for mounting a semiconductor main chip, a plurality of leads extending from opposite sides of the frame portion toward the inner area of the lead frame, with the tip portion thereof being positioned near at the main bed portion, some of the plurality of leads having a sub-bed portion formed at a predetermined area for mounting a semiconductor sub-chip, and a suspension pin formed outside of a predetermined lead which is positioned at the outermost position of the plurality of leads, the suspension pin extending along the predetermined lead and being resin sealed with the plurality of leads at a resin molding process of semiconductor device manufacturing processes.

A semiconductor device of this invention is formed by resin sealing a lead frame mounting semiconductor chips, the lead frame which is made of a die-cut conductive plate and used for manufacturing a semiconductor device, comprising a frame portion at the peripheral area of the lead frame, a main bed portion supported by support members extending from the frame portion for mounting a semiconductor main chip, a plurality of leads extending from opposite sides of the frame portion toward the inner area of the lead frame, with the tip portion thereof being positioned near at the main bed portion, some of the plurality of leads having a sub-bed portion formed at a predetermined area for mounting a semiconductor sub-chip, and a suspension pin formed outside of a predetermined lead which is positioned at the outermost position of the plurality of leads, the suspension pin extending along the predetermined lead and being resin sealed with the plurality of leads at a resin molding process of semiconductor device manufacturing processes.

DESCRIPTION OF THE PREFERRED EMBODIMENT

An embodiment of this invention will be described with reference to FIGS. 3A and 3B. As seen from FIG. 3A, a plate made of pure iron, iron alloy (Fe-Ni), copper, or copper alloy is press worked to form a DIP type lead frame LF or a surface mount device (SMD) type lead frame LF combining an SIP type and DIP type. The lead frame LF is formed with leads 20, 20, ... Each lead 20 extends from a frame portion 19 at the periphery of the lead frame LF toward the center thereof, and functions as an outer lead after resin sealing. In the embodiment shown in FIGS. 3A and 3B, the leads 20, 20, ... extend in opposite two directions. The leads may be disposed extending in four directions radially.

Figure 1A:
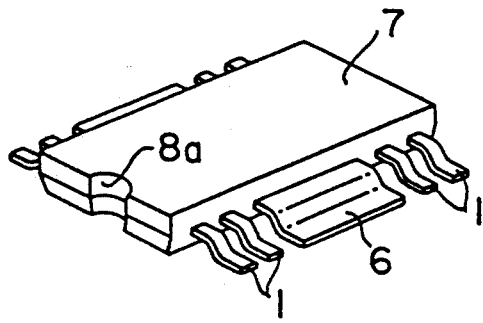
FIG. 1A is a perspective view of a conventional semiconductor device.
Figure 1B:
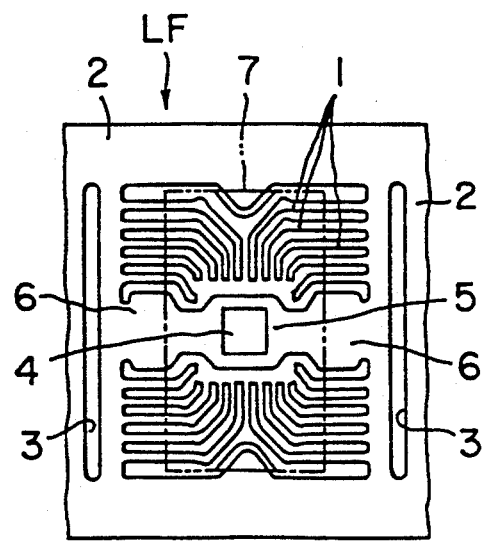
FIG. 1B is a plan view of a lead frame used for manufacturing the semiconductor device shown in FIG. 1A.
Figure 2A:
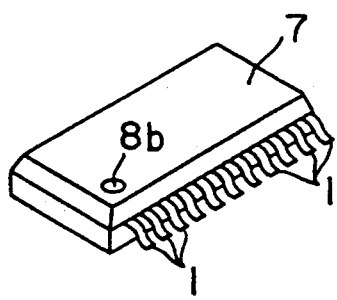
FIG. 2A is a perspective view of another conventional semiconductor device.
Figure 2B:
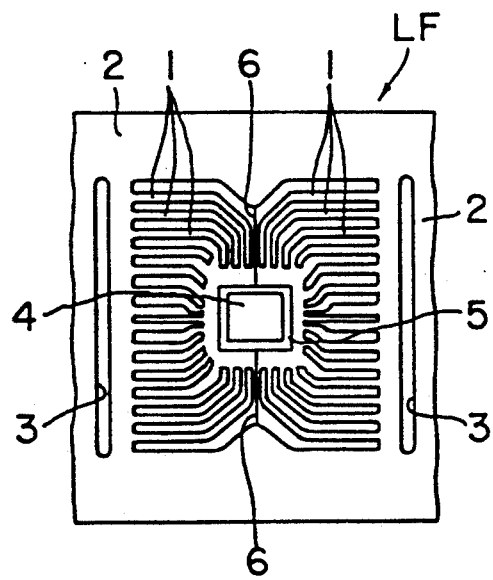
FIG. 2B is a plan view of a lead frame used for manufacturing the semiconductor device shown in FIG. 2A.
Figure 3A:
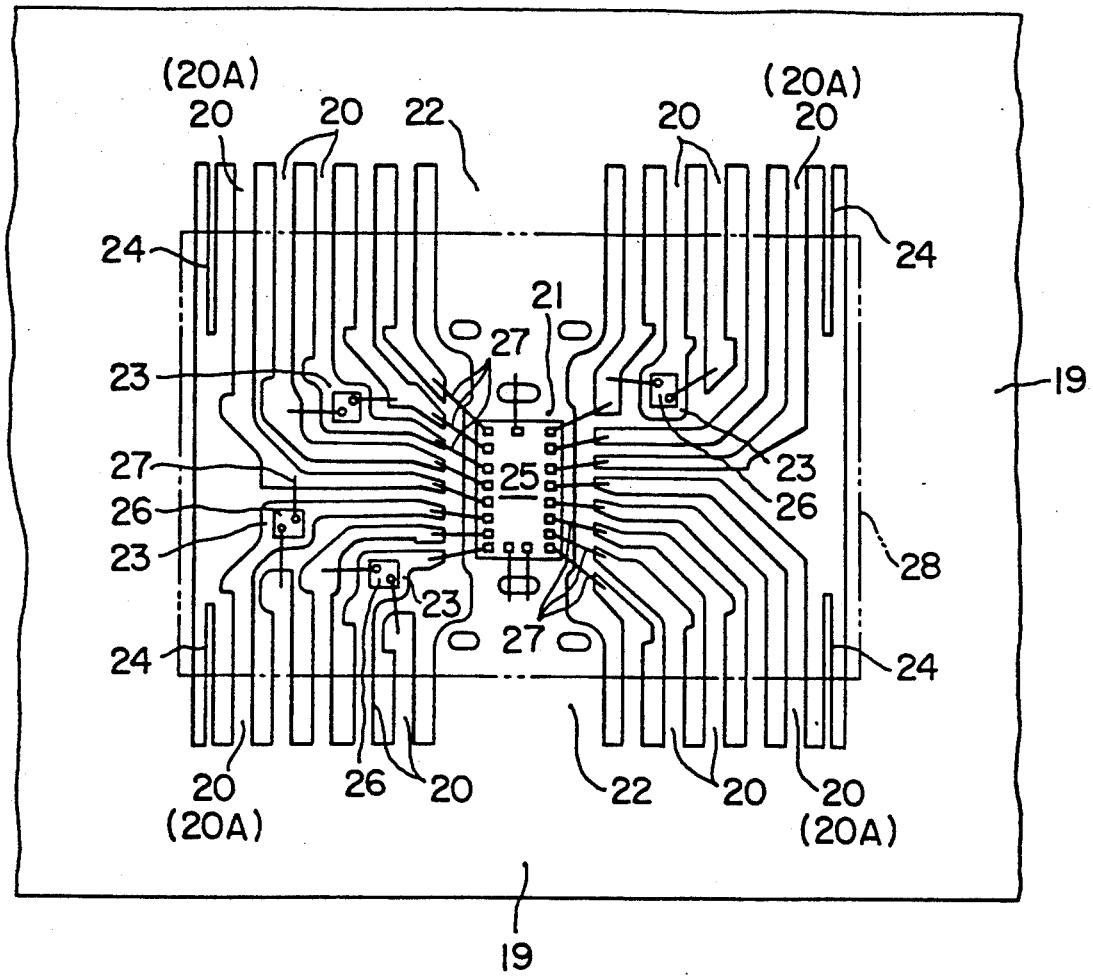
FIG. 3A is a plan view of a lead frame according to the present invention.
Figure 3B:
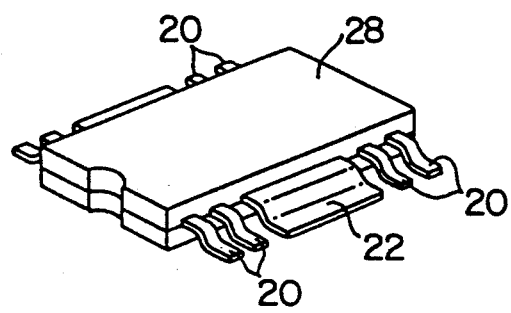
FIG. 3B is a perspective view of a semiconductor device using the lead frame shown in FIG. 3A.

As shown in FIG. 3A, a bed portion (main bed portion) 21 having the maximum area is formed at the position near the tip ends or free ends of the leads 20, i.e., at substantially the center of the frame portion 19. This bed portion 21 is held at opposite sides by support members 22 and 22 having a large width. Some of the leads 20 are formed with a bed portion (sub-bed portion) 23 at the intermediate area thereof. Suspension pins 24, 24, ... are formed outside of outmost leads 20A, 20A, ..., extending along the base portion (the portion of a lead extending out of the resin package) of the outmost leads 20A, 20A, ... Although four suspension pins 24 are formed and shown in FIG. 3A, only two suspension pins 24 may be formed facing each other diagonally.

Semiconductor pellets (main chip, sub-chips) 25 and 26 having predetermined characteristics are mounted on the bed portions 21 and 23. Between the semiconductor pellets 25 and 26 and the leads 20 and support members 22, wires 27 are ball-bonded by means of thermocompression bonding or ultra sonic thermocompression bonding. Bonding is effected for the wires 27 in FIG. 3A. For a more complicated circuit, a so-called Turn Over Bonding (TOB) may be used wherein other wires are further bonded laying above the bonded wires 27.

At the succeeding resin sealing process, molten resin is introduced within the cavity of a metal mold from a gate and via runners formed in the mold. For this reason, it is preferable not to position the wires 27 in the direction intersecting with the flow paths of molten resin.

Although not shown in FIG. 3A, in order to increase the mechanical strength of leads, narrow metal couplers may be used to couple contiguous leads together in the widthwise direction thereof or in the lateral direction of the lead frame (in the direction of intersecting the leads). The metal filaments are also cut and removed at the press process. In this case, the leads 20 are not separated or displaced because of the presence of the suspension pins 24, 24, ... A lead frame with a plurality of semiconductor pellets 25 and 26 being mounted can be obtained accordingly. This lead frame is sent to a resin sealing process stage to form a resin sealed block 28 which is a product shown in FIG. 3B. The suspension pins 24, 24, ... are cut and removed when the leads 20 are formed into outer leads.

A semiconductor device using the lead frame described above is manufactured in the following manner.

The semiconductor chips 25 and 26 are mounted on the bed portions formed at the leads 20 and support members 22 of the lead frame.

Next, the chips 25 and 26 are connected to the leads 20 and support members 22 by using bonding wires 27.

The resin block 28 is then formed through resin molding. Within this block 28, the leads 20, support members 22, and suspension pins 24 are integrally molded.

Thereafter, the leads 20 and support members 22 are cut while maintaining the coupling between the lead frame and block 28 by means of the suspension pins 24.

A semiconductor device is completed thereafter by known processes.

The following advantageous effects can be obtained by the present invention.

(1) It is possible to provide a semiconductor device having a high packing density and high value, thereby realizing a light, compact, low cost, and highly reliable electronic apparatus.

(2) High efficient manufacturing is possible without changing a conventional semiconductor device manufacturing line.

(3) It is possible to carry out a method of manufacturing a semiconductor device having such a system scale that a plurality of chips are mounted on a plurality of lead frames having islands, with very low cost as compared with a method which uses a particular pattern of a circuit board or the like. According to the semiconductor device of this invention, suspension pins can be provided without significant disadvantages from the viewpoint of island forming space. Accordingly, it is possible to form a circuit pattern even for a semiconductor device of a high packing density.

What is claimed is:

1. A lead frame made of a die-cut conductive plate and used for manufacturing a semiconductor device, comprising:
   a frame portion at the peripheral area of said lead frame;
   a main bed portion supported by support members extending from said frame portion for mounting a semiconductor main chip;
   a plurality of leads extending from opposite sides of said frame portion toward the inner area of said lead frame, with the tip portion thereof being positioned near said main bed portion, some of said plurality of leads having a sub-bed portion formed at a predetermined area for mounting a semiconductor sub-chip; and
   a suspension pin formed outside of a predetermined lead which is positioned at the outmost position of said plurality of leads, said suspension pin extending along said predetermined lead and being resin sealed with said plurality of leads at a resin molding process of semiconductor device manufacturing processes.

2. A lead frame according to claim 1, wherein said sub-bed portion is formed at the intermediate area between the base portion and tip portion of said predetermined lead.

3. A lead frame according to claim 1, wherein said support members are wider than said main bed portion.

4. A lead frame according to claim 1, wherein said sub-bed portion is wider than said predetermined lead.

5. A lead frame according to claim 1, wherein said support members also functions as leads.

6. A semiconductor device formed by resin sealing a lead frame mounting semiconductor chips thereon, said lead frame made of a die-cut conductive plate and used for manufacturing a semiconductor device, comprising:
 a frame portion at the peripheral area of said lead frame;
 a main bed portion supported by support members extending from said frame portion for mounting a semiconductor main chip;
 a plurality of leads extending from opposite sides of said frame portion toward the inner area of said lead frame, with the tip portion thereof being positioned near said main bed portion, some of said plurality of leads having a sub-bed portion formed at a predetermined area for mounting a semiconductor sub-chip; and
 a suspension pin formed outside of a predetermined lead which is positioned at the outmost position of said plurality of leads, said suspension pin extending along said predetermined lead and being resin sealed with said plurality of leads at a resin molding process of semiconductor device manufacturing processes.

7. A lead frame according to claim 6, wherein said sub-bed portion is formed at the intermediate area between the base portion and tip portion of said predetermined lead.

8. A lead frame according to claim 6, wherein said support members are wider than said main bed portion.

9. A lead frame according to claim 6, wherein said sub-bed portion is wider than said predetermined lead.

10. A lead frame according to claim 6, wherein said support members also functions as leads.

* * * * *